(12) United States Patent
Koller

(10) Patent No.: US 8,482,019 B2
(45) Date of Patent: Jul. 9, 2013

(54) ELECTRONIC LIGHT EMITTING DEVICE AND METHOD FOR FABRICATING THE SAME

(75) Inventor: Adolf Koller, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 262 days.

(21) Appl. No.: 12/695,635

(22) Filed: Jan. 28, 2010

(65) Prior Publication Data

US 2011/0180837 A1 Jul. 28, 2011

(51) Int. Cl.
*H01L 33/00* (2010.01)

(52) U.S. Cl.
USPC ............... 257/98; 257/99; 257/672; 257/676; 257/E33.059

(58) Field of Classification Search
USPC ................. 257/98, 99, 672, 676, E33.059
See application file for complete search history.

(56) References Cited

U.S. PATENT DOCUMENTS

| | | | |
|---|---|---|---|
| 6,988,819 B2 | 1/2006 | Siktberg et al. | |
| 8,030,674 B2 * | 10/2011 | Hsu et al. | 257/98 |
| 2006/0022315 A1 * | 2/2006 | Huang et al. | 257/676 |
| 2011/0147910 A1 * | 6/2011 | Reynolds et al. | 257/686 |
| 2011/0204407 A1 * | 8/2011 | Cupta et al. | 257/98 |

* cited by examiner

*Primary Examiner* — Tan N Tran
(74) *Attorney, Agent, or Firm* — Slater & Matsil, L.L.P.

(57) ABSTRACT

An electronic light emitting device includes a leadframe, a light emitting diode arranged above a first surface of the leadframe, a semiconductor chip including an electronic circuit to drive the light emitting diode, the semiconductor chip arranged above a second surface of the leadframe opposite to the first surface of the leadframe.

26 Claims, 5 Drawing Sheets

ELECTRONIC LIGHT EMITTING DEVICE AND METHOD FOR FABRICATING THE SAME

TECHNICAL FIELD

The present invention relates to an electronic light emitting device and a method for fabricating the same.

BACKGROUND

An electronic light emitting device includes a light emitting diode and an electronic circuit for driving the light emitting diode. Both electrical components need to be integrated together in a module to become part of a lamp, for example. Moreover the heat generated by the electronic light emitting device needs to be dissipated efficiently so that no damage occurs during operation to the various components.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of the embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
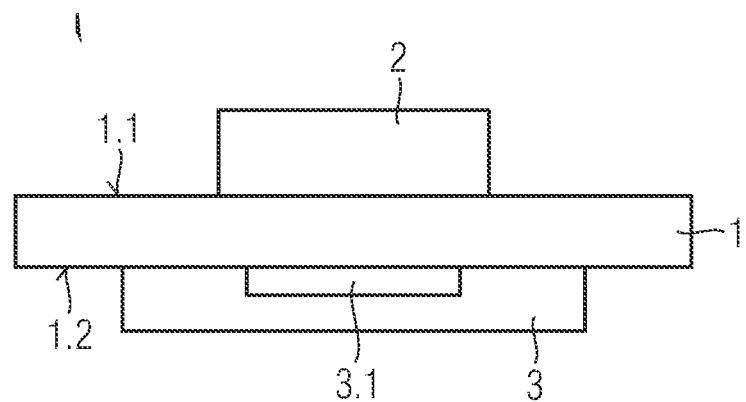
FIG. 1 shows a schematic cross-sectional representation of an electronic light emitting device according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless of whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

In general the term "semiconductor chip" as used in this application can have different meanings one of which is a semiconductor die or semiconductor substrate including an electrical circuit. Another meaning is a semiconductor package device, i.e., semiconductor die embedded in an encapsulant material having outer electrical contact pads connected with the electrical contact pads of the semiconductor die. Such a semiconductor package can, for example, be fabricated by wafer level packaging or extended wafer level packaging.

In several embodiments chips, dies or diodes are applied to the leadframe. It should be appreciated that any such terms as "applied" or "attached" are meant to cover literally all kinds and techniques of applying layers or sheets onto each other or onto a leadframe. For example, they are meant to cover techniques like soldering or gluing as well as other techniques using adhesive materials for attaching two bodies to each other.

The devices used there, such as the diodes, semiconductor chips or semiconductor dies may include contact elements or contact pads on one or more of their outer surfaces wherein the contact elements serve for electrically contacting the respective device to the leadframe. The contact elements may be made from any electrically conducting material, e.g. from a metal such as aluminum, gold, or copper, for example, or a metal alloy, e.g. solder alloy, or an electrically conducting organic material, or an electrically conducting semiconductor material.

The electronic light emitting device may become packaged or covered with an encapsulant material. An encapsulant material can also be used for fabricating the semiconductor chip. The encapsulant material can be any electrically insulating material such as, for example, any kind of molding material, any kind of epoxy material, or any kind of resin material with or without any kind of filler materials. In special cases it could be advantageous to use a conductive encapsulant material.

In particular, when fabricating the semiconductor chips and the packaging of the semiconductor dies with the encapsulant material, fan-out embedded dies can be fabricated. The fan-out embedded dies can be arranged in an array having the form, e.g., of a wafer and will thus be called a "re-configured wafer" further below" However, it should be appreciated that the fan-out embedded die array is not limited to the form and shape of a wafer but can have any size and shape and any suitable array of semiconductor chips embedded therein. This technology is called extended wafer level packaging technology.

In the claims and in the following description different embodiments of a method of fabricating a semiconductor device are described as a particular sequence of processes or measures, in particular, in the flow diagrams. It is to be noted that the embodiments should not be limited to the particular sequence described. Particular ones or all of different processes or measures can also be conducted simultaneously or in any other useful and appropriate sequence.

Referring to FIG. 1, there is shown a cross-sectional side view representation of an electronic light emitting device according to an embodiment. The electronic light emitting device 10 as shown in FIG. 1 comprises a leadframe 1, a light emitting diode 2 arranged above a first surface 1.1 of the leadframe 1, a semiconductor chip 3 including an electronic circuit 3.1 to drive the light emitting diode 2, the semiconductor chip 3 arranged above a second surface 1.2 of the leadframe 1 opposite to the first surface 1.1 of the leadframe 1.

According to an embodiment of the electronic light emitting device 10, the light emitting diode 2 is attached to the first surface 1.1 of the leadframe 1 in a way so that the whole surface of one side of the body of the light emitting diode 2 is in mechanical contact with the first surface 1.1 of the leadframe 1. According to an embodiment thereof the light emitting diode 2 can be soldered or glued to the first surface 1.1 of the leadframe 1. In this way an optimum thermal conductance can be reached between the light emitting diode 2 and the leadframe 1 and heat generated in the light emitting diode 2 can be very efficiently dissipated. Further embodiments with even more improved heat dissipation characteristics will be shown in greater detail below.

According to an embodiment of the electronic light emitting device 10, the semiconductor chip 3 is made of a bare semiconductor die, i.e., by fabricating one or more electronics circuits 3.1 on a semiconductor wafer by methods as known in the art, and then singulating the semiconductor wafer into a plurality of semiconductor dies each one of them including an electronic circuit 3.1 at a surface region thereof. According to another embodiment of the electronic light emitting device 10, the semiconductor chip 3 is made of a package containing a semiconductor die, e.g., by wafer level packaging or extended wafer level packaging as is known in the art. This means that the semiconductor die is embedded in an encapsulating material and electrical contact pads of the semiconductor die are electrically connected to contact pads of the package at a surface thereof.

According to an embodiment of the electronic light emitting device 10, the semiconductor chip 3 is attached to the second surface 1.2 of the leadframe 1 in a way that the whole surface of one side of the semiconductor chip 3 is in mechanical contact with the second surface 1.2 of the leadframe 1. According to another embodiment of the electronic light emitting device 10, the semiconductor chip 3 is connected to the second surface 1.2 of the leadframe 1 by means of solder balls (not shown) wherein the solder balls not only serve for mechanically connecting the semiconductor chip 3 to the leadframe 1 but also provide for electrically contacting particular portions of the leadframe 1 to particular electrical contact pads of the semiconductor chip 3.

According to an embodiment of the electronic light emitting device 10, the device further includes an encapsulating material encapsulating the light emitting diode 2 and the semiconductor chip 3 as will be shown in greater detail in further embodiments below.

According to an embodiment of the electronic light emitting device 10, the leadframe 1 includes a main part and additional parts, wherein the main part has a planar structure and includes a first surface and a second surface, wherein the light emitting diode 2 is arranged above the first surface and the semiconductor chip 3 is arranged above the second surface, and the additional parts extend at least in part in directions having non-zero angles with the plane of the main part, respectively.

According to an embodiment thereof the additional parts are situated on the side of the second surface of the main part.

According to an embodiment thereof the additional parts include bent portions, respectively.

According to an embodiment thereof the additional parts include a first portion, a second portion, and a third portion, respectively, wherein the first portion lies in one and the same plane as the main part, the third part lies in another plane as the main part, and the second portion connects the first portion to the third portion.

According to an embodiment thereof the additional parts include first additional parts and second additional parts, wherein the first additional parts are connected contiguously with the main part, and the second additional parts are not connected contiguously with the main part.

According to an embodiment thereof the second additional parts serve as electrical connectors.

According to an embodiment of the electronic light emitting device 10, device 10 is configured to be operated with a light emitting diode 2 being able to emit light with a light output power greater than 1 W, or even greater than 5 W, or even greater than 10 W.

Figure 2:
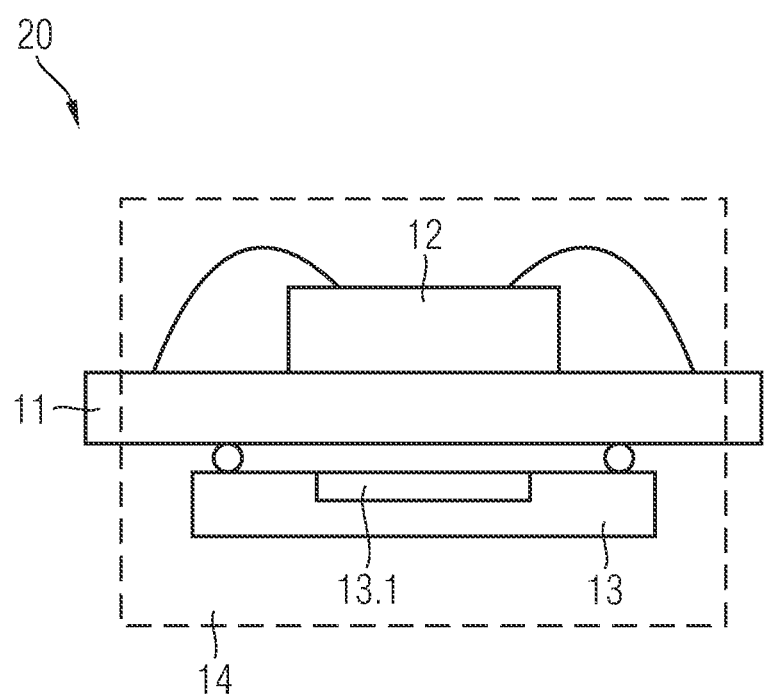
FIG. 2 shows a schematic cross-sectional representation of an electronic light emitting device according to an embodiment.

Referring to FIG. 2, there is shown a cross-sectional side view representation of an electronic light emitting device 20 according to an embodiment. The electronic light emitting device 20 as shown in FIG. 2 includes a leadframe 11, a light emitting diode 12 electrically connected with the leadframe 11 and being capable to emit light with a light output power greater than 1 W, a semiconductor chip 13 electrically connected with the leadframe 11 and including an electronic circuit 13.1 to drive the light emitting diode 12, and an encapsulation material 14 encapsulating the light emitting diode 12 and the semiconductor chip 13.

According to an embodiment of the electronic light emitting device 20, the light emitting diode 12 is arranged above a first surface of the leadframe 11, and the semiconductor chip 13 is arranged above a second surface of the leadframe 11 opposite to the first surface of the leadframe 11. In FIG. 2 such an embodiment is shown wherein the light emitting diode 12 and the semiconductor chip 13 are arranged directly above each other with the leadframe 11 in between.

Further embodiments of the electronic light emitting device 20 can be formed analogous to the embodiments as were described in connection with the electronic light emitting device 10 of FIG. 1.

Figure 3A:
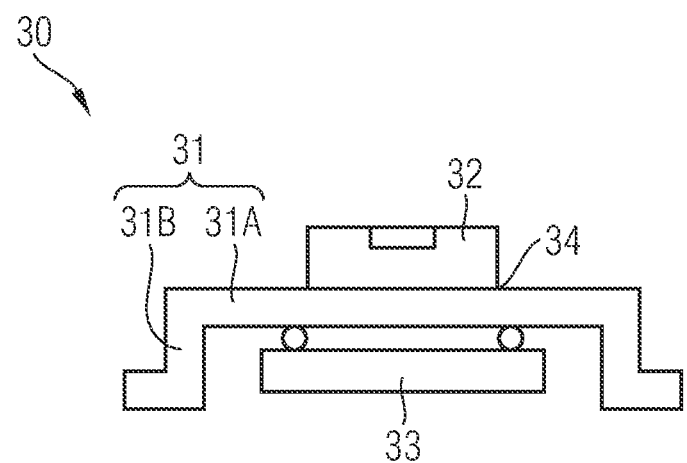
FIG. 3A-3C show a schematic representation of an electronic light emitting device according to an embodiment in a cross-sectional side view (3A), a top view (3B), and in a cross-sectional side view with an applied encapsulant material (3C)
Figure 3B:
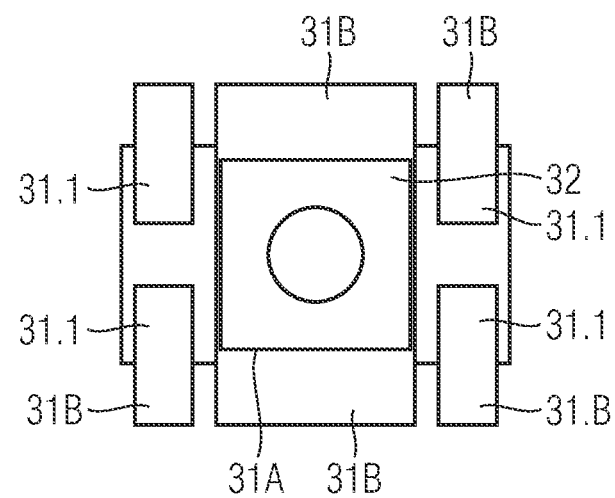
Figure 3C:
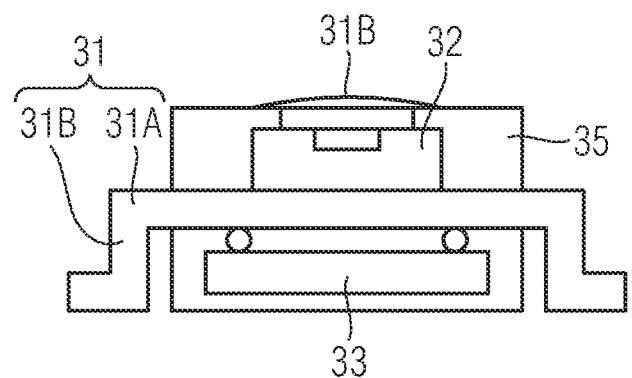

Referring to FIGS. 3A-3C, there is shown an embodiment of an electronic light emitting device according to an embodiment in a cross-sectional side view representation (3A), a top view representation (3B), and a cross-sectional side view representation after application of an encapsulation material (3C). The electronic light emitting device 30 as shown in FIGS. 3A-3C includes a leadframe 31, a light emitting diode 32, and a semiconductor chip 33 including an electronic circuit for driving the light emitting diode 32.

The leadframe 31 originates, for example, from a plane sheet of metal like copper or a copper alloy and is formed to the shape as shown in the Figures, e.g., by cutting and bending specific portions of the leadframe. The leadframe 31 thus includes a main part 31A and additional parts 31B which are bent out of the plane of the main part 31A. As can be seen in FIG. 3A, the additional parts 31B are bent down so that they form a common coplanar surface for mounting the leadframe 31 onto a main board, like, for example, a PCB board. As can be seen, the additional parts 31B include a first portion, a second portion, and a third portion, respectively, wherein the first portion lies in one and the same plane as the main part 31A, the third part lies in another plane as the main part 31A, and the second portion connects the first portion to the third portion. The additional parts 31B are thus responsible for fastening the leadframe 31 to the main board and also for dissipating the heat generated by the light emitting diode 32. It is therefore advantageous to form the additional parts 31B as broad and large as possible in order to efficiently dissipate the heat. The electronic light emitting device of FIGS. 3A-3C is configured due to the form of the leadframe 31 and the additional parts 31B to be operated together with light emitting diodes 32 being capable to emit light with an output power up to 1 to 3 W.

As an be seen in the top view of FIG. 3B, the additional parts 31B of the leadframe 31 can either be ones which are contiguously connected with the main part 31A or they can be ones which are contiguously connected with leadframe connection parts 31.1 which were part of the original leadframe but had been separated from it during the fabrication process of the electronic device.

The light emitting diode 32 has the form of a block like device and is mounted on an upper face of the main part 31A of the leadframe 31 such that a lower face of the light emitting diode 32 is entirely in mechanical contact with the upper face of the main part 31A of the leadframe 31. The light emitting diode 32 is attached to the leadframe 31 by soldering or gluing so that that there is a soldering layer 34 or glue layer in between the lower surface of the light emitting diode 32 and the upper face of the main part 31A of the leadframe 31. Also other means of attaching the light emitting diode 32 to the leadframe 31 are possible wherein good thermal coupling should be provided. The main part 31A of the leadframe 31 serves as support and heat sink for the light emitting diode 32. However, it can also be the case that the main part 31A of the leadframe 31 also serves as an electrical connector to supply current to the light emitting diode 32.

The light emitting diode 32 can be in principle any type of light emitting diode. It can be a light emitting diode having both electrical connection terminals at the upper surface thereof. It can also be a light emitting diode having one electrical connection terminal at the upper surface thereof and one electrical connection terminal at the lower surface thereof.

The semiconductor chip 33 can be made of a bare semiconductor die, i.e., a piece of a semiconductor like silicon having an electronic circuit at a surface region thereof for driving the light emitting diode 32, the electronic circuit being connected to electrical contact pads at the semiconductor surface. Alternatively the semiconductor chip 33 can also be made of a packaged device, wherein the semiconductor die is embedded within an encapsulation material and the electrical contact pads at the semiconductor surface are connected to electrical contact pads at the outer surface of the encapsulation material. Such a packaged device can also contain a redistribution layer (RDL) for in order to allow a fan-out of the arrangement of electrical contact pads and the device can be fabricated, for example, by a wafer level packaging or an extended wafer level packaging technology.

The semiconductor chip 33 can be connected to a lower surface of the main part 31A of the leadframe 31 by means of solder balls in which case the connection can be as well an electrical connection in that electrical contact pads on the upper surface of the semiconductor chip 33 are electrically connected by the solder balls to the leadframe connection parts 31.1. The semiconductor chip 33 can alternatively be connected in a surface-to-surface-connection with the main part 31A of the leadframe 31 as will be shown in the embodiment of FIG. 3C.

Referring to FIG. 3C, there is shown a cross sectional side view representation of the device after application of the encapsulation material. As can be seen, the encapsulation material 35 is applied such that the light emitting diode 32 and the semiconductor chip 33 are completely embedded within the encapsulation material 35 and the additional parts 31B of the leadframe 31 are not embedded within the encapsulation material 35. The encapsulation material 35 can be chosen such that it is transparent for the light emitted by the light emitting diode 32 in which case the light emitting diode 32 can be covered on its upper surface by the encapsulation material 35. Alternatively or if the encapsulation material 35 is not transparent for the light emitted by the light emitting diode 32, a light output area at the upper surface is kept free of encapsulation material 35 and in addition, if desired, a lens 36 can be formed within this area.

Figure 4:
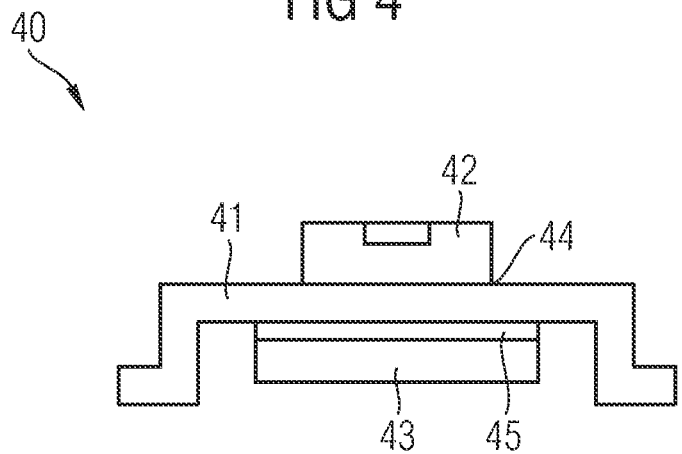
FIG. 4 shows a schematic cross-sectional representation of an electronic light emitting device according to an embodiment.

Referring to FIG. 4, there is shown a schematic cross-sectional representation of an electronic light emitting device according to an embodiment. This embodiment has to be compared with the previously described embodiment of FIGS. 3A-3C, in particular, with the representation of FIG. 3A. As can be seen in FIG. 4, in the electronic light emitting device 40 the semiconductor chip 43 is connected to the leadframe 41 by a surface-to-surface connection of an upper surface of the semiconductor chip 43 to a lower surface of the leadframe 41. The connection can be accomplished in the same way as with connecting the light emitting diode 42 to the leadframe 41, namely by soldering or gluing. There is provided a first soldering layer 44 between the light emitting diode 42 and the leadframe 41 and a second soldering layer 45 between the leadframe 41 and the semiconductor chip 43. In this way the electrical contact pads of the semiconductor chip 43 will be automatically electrically connected with the leadframe connection parts 41.1 (not shown, see leadframe parts 31.1 in FIG. 3). One advantage of the embodiment of FIG. 4 is that also the semiconductor chip 43 is connected to the leadframe 41 such that heat produced within the semiconductor chip 43 can be efficiently conducted away by the leadframe 41.

Figure 5A:
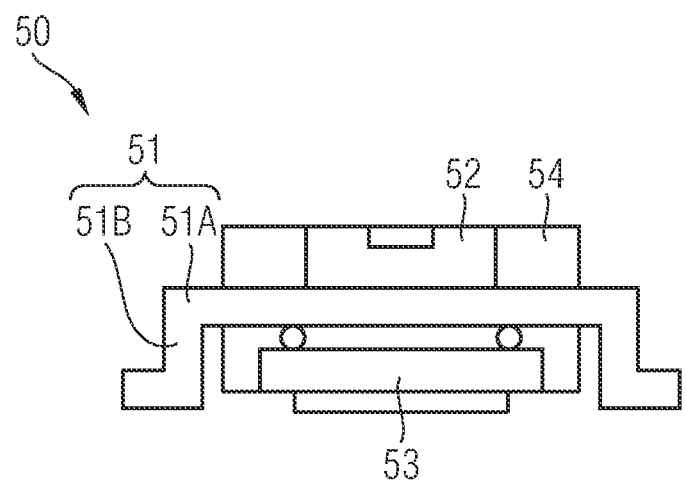
FIGS. 5A, 5B show a schematic representation of an electronic light emitting device according to an embodiment in a cross-sectional side view (5A), and a top view (5B)
Figure 5B:
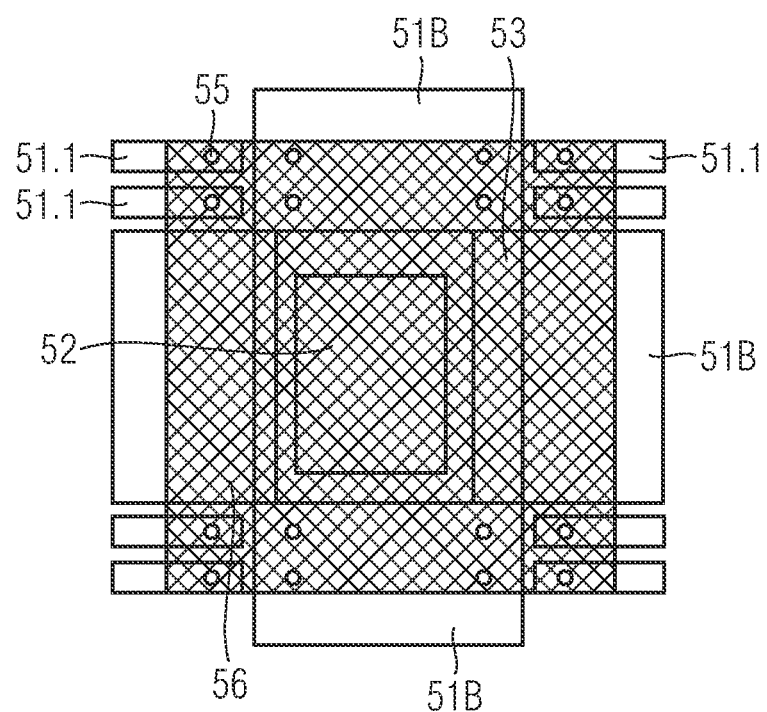

Referring to FIGS. 5A and 5B, there is shown a schematic representation of an electronic light emitting device according to an embodiment in a cross-sectional side view (5A), and a top view (5B). The electronic light emitting device 50 as shown in FIGS. 5A and 5B includes a leadframe 51, a light emitting diode 52, a semiconductor chip 53, and an encapsulation material 54. The leadframe 51 includes a main part 51A and additional parts 51B wherein the additional parts 51B are either contiguously connected with the main part 51A or they are contiguously connected with leadframe connection parts 51.1 which are separated from the remaining part of the leadframe 51.

The embodiment of an electronic light emitting device 50 as shown in FIGS. 5A and 5B is configured to be operated together with a very high output power light emitting diode 52 which means a light emitting diode 52 which is capable to emit light with a light output power greater than 5 W, or even greater than 10 W. This is achieved by using a leadframe 51 including very broad additional parts 51B as can be seen in the top view representation of FIG. 5B. Such broad additional parts 51B are able to very efficiently conduct away the heat generated within the light emitting diode 52 so that it can be operated at such high input and output power levels.

The other features of the embodiment of FIGS. 5A and 5B are similar to the previously described embodiments. The semiconductor chip 53 is connected to the leadframe 51 by means of solder balls 55. Some of them are connected to the main part 51A of the leadframe 51 and thus do not serve electrical connections whereas others electrically connect the electrical contact pads of the semiconductor chip 53 with the leadframe connection parts 51.1, respectively. From two ones of the leadframe connection parts 51.1 wire bonds 56 lead to the electrical terminals of the light emitting diode 52 at an upper surface thereof.

The embodiment of an electrical light emitting device 50 of FIGS. 5A, B can be utilized as a very high power package in, for example, a pocket lamp or a head light.

Figure 6:
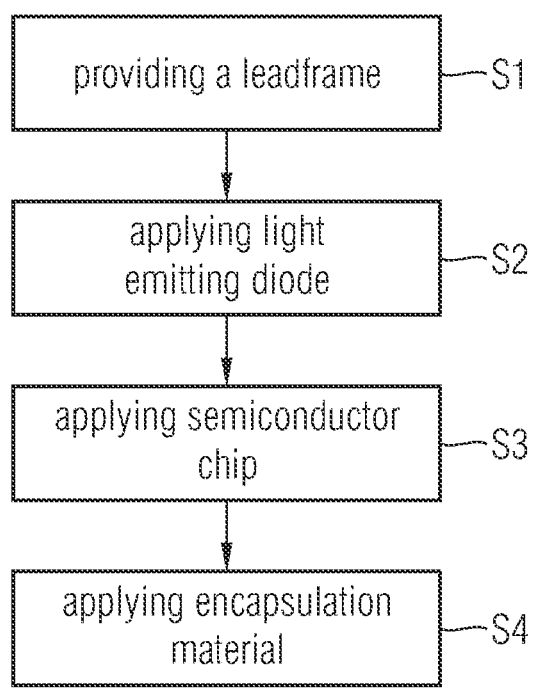
FIG. 6 shows a flow diagram of a method for fabricating an electronic light emitting device according to an embodiment.

Referring to FIG. 6, there is shown a flow diagram of a method for fabricating an electronic light emitting device according to an embodiment. The method includes providing a leadframe (s1), applying a light emitting diode to a first surface of the leadframe (s2), applying a semiconductor chip to a second surface of the leadframe opposite to the first surface of the leadframe, the semiconductor chip including an electronic circuit to drive the light emitting diode (s3), and applying an encapsulation material to encapsulate the light emitting diode and the semiconductor chip (s4).

According to an embodiment of the method, the method further includes electrically connecting the light emitting diode to the leadframe, and electrically connecting the semiconductor device to the leadframe.

According to an embodiment of the method, one or more of the light emitting diode and the semiconductor chip are applied to the leadframe by surface-to-surface connecting of a surface of the light emitting diode to a surface of the leadframe.

According to an embodiment of the method, the leadframe is pre-fabricated in a way so that it includes a main part and additional parts, wherein the additional parts extend at least in part in directions having non-zero angles with the plane of the main part, respectively. In particular the additional parts are fabricated by bending and the additional parts are fabricated such that they are provided at the side of the second surface of the leadframe.

What is claimed is:

1. An electronic light emitting device, comprising:
   a leadframe;
   a light emitting diode;
   a packaged semiconductor chip comprising an electronic circuit to drive the light emitting diode, wherein the leadframe is located between the light emitting diode and the packaged semiconductor chip, and wherein an electric circuit of the packaged semiconductor chip is soldered to the leadframe; and
   an encapsulating material encapsulating the leadframe, the light emitting diode and the packaged semiconductor chip.

2. The electronic light emitting device according to claim 1, wherein the leadframe comprises a main part and additional parts, wherein the main part has a planar structure and comprises a first surface and a second surface, wherein the main part is located between the light emitting diode and the packaged semiconductor chip, and the additional parts extend at least in part in directions having non-zero angles with respect to a plane of the main part, respectively.

3. The electronic light emitting device according to claim 2, wherein the additional parts are located on the second surface of the main part.

4. The electronic light emitting device according to claim 2, wherein the additional parts comprise bent portions.

5. The electronic light emitting device according to claim 2, wherein the additional parts comprise a first portion, a second portion, and a third portion, wherein the first portion lies in the same plane as the main part, the third portion lies in another plane as the main part, and the second portion connects the first portion to the third portion.

6. The electronic light emitting device according to claim 2, wherein the additional parts comprise first additional parts and second additional parts, wherein the first additional parts are connected contiguously with the main part, and the second additional parts are not connected contiguously with the main part.

7. The electronic light emitting device according to claim 6, wherein the second additional parts serve as electrical connectors.

8. The electronic light emitting device according to claim 1, wherein the light emitting diode is able to emit light with a light output power greater than 1 W.

9. The electronic light emitting device according to claim 8, wherein the light emitting diode is able to emit light with a light output power greater than 5 W.

10. The electronic light emitting device according to claim 9, wherein the light emitting diode is able to emit light with a light output power greater than 10 W.

11. An electronic light emitting device, comprising:
    a leadframe;
    a light emitting diode electrically connected to the leadframe and configured to emit light;
    a packaged semiconductor chip electrically connected to the leadframe and comprising an electronic circuit to drive the light emitting diode, the packaged semiconductor chip comprising a redistribution layer (RDL); and
    an encapsulation material encapsulating the light emitting diode and the packaged semiconductor chip.

12. The electronic light emitting device according to claim 11, wherein the light emitting diode is arranged on a first surface of the leadframe, and the packaged semiconductor chip is arranged on a second surface of the leadframe, the second surface opposite the first surface of the leadframe.

13. The electronic light emitting device according to claim 11, wherein the leadframe comprises a main part and additional parts, wherein the main part has a planar structure and comprises a first surface and a second surface, wherein the light emitting diode is arranged on the first surface and the packaged semiconductor chip is arranged on the second surface, and the additional parts extend at least in part in directions having non-zero angles with respect to a plane of the main part.

14. The electronic light emitting device according to claim 13, wherein the additional parts are located on the second surface of the main part.

15. The electronic light emitting device according to claim 13, wherein the additional parts comprise bent portions.

16. The electronic light emitting device according to claim 13, wherein the additional parts comprise a first portion, a second portion, and a third portion, wherein the first portion lies in the same plane as the main part, the third portion lies in another plane as the main part, and the second portion connects the first portion to the third portion.

17. The electronic light emitting device according to claim 13, wherein the additional parts comprise first additional parts and second additional parts, wherein the first additional parts are connected contiguously with the main part, and the second additional parts are not connected contiguously with the main part.

18. The electronic light emitting device according to claim 17, wherein the second additional parts serve as electrical connectors.

19. The electronic light emitting device according to claim 11, wherein the light emitting diode is able to emit light with a light output power greater than 5 W.

20. The electronic light emitting device according to claim 11, wherein the light emitting diode is able to emit light with a light output power greater than 10 W.

21. A method for fabricating an electronic light emitting device, the method comprising:
    attaching a light emitting diode to a first surface of a leadframe;
    attaching a packaged semiconductor chip to a second surface of the leadframe opposite to the first surface of the leadframe, wherein the packaged semiconductor chip comprises an electronic circuit configured to drive the light emitting diode, and wherein an electric circuit of the packaged semiconductor chip is soldered to the second surface of the leadframe; and
    encapsulating the light emitting diode and the packaged semiconductor chip.

22. The method according to claim 21, further comprising:
    electrically connecting the light emitting diode to the leadframe, and
    electrically connecting the packaged semiconductor chip to the leadframe.

23. The method according to claim 21, further comprising forming a redistribution layer (RDL) in the packaged semiconductor chip.

24. The method according to claim 21, wherein the packaged semiconductor chip is packaged on wafer level.

25. The electronic light emitting device according to claim 11, further comprising contact pads in a fan-out region of the packaged semiconductor chip.

26. The electronic light emitting device according to claim 11, wherein the light emitting diode is able to emit light with a light output power greater than 1 W.

* * * * *